(12) United States Patent
Ji et al.

(10) Patent No.: US 12,154,860 B2
(45) Date of Patent: Nov. 26, 2024

(54) METHOD OF FORMING A SEMICONDUCTOR DEVICE INCLUDING VERTICAL CONTACT FINGERS

(71) Applicant: WESTERN DIGITAL TECHNOLOGIES, INC., San Jose, CA (US)

(72) Inventors: Zhongli Ji, Shanghai (CN); Ning Ye, Milpitas, CA (US); Chin-Tien Chiu, Taichung (TW); Fen Yu, Shanghai (CN)

(73) Assignee: Sandisk Technologies, Inc., Milpitas, CA (US)

( * ) Notice: Subject to any disclaimer, the term of this patent is extended or adjusted under 35 U.S.C. 154(b) by 246 days.

(21) Appl. No.: 17/348,989

(22) Filed: Jun. 16, 2021

(65) Prior Publication Data
US 2022/0406724 A1    Dec. 22, 2022

(51) Int. Cl.
*H01L 23/538*  (2006.01)
*H01L 23/31*   (2006.01)
*H01L 23/498*  (2006.01)
*H01L 25/065*  (2023.01)

(52) U.S. Cl.
CPC ...... *H01L 23/5387* (2013.01); *H01L 23/3121* (2013.01); *H01L 23/49811* (2013.01); *H01L 25/0652* (2013.01); *H01L 2225/06506* (2013.01); *H01L 2225/0651* (2013.01); *H01L 2225/06562* (2013.01)

(58) Field of Classification Search
CPC ... H05K 1/11; H05K 1/14; H05K 1/18; H05K 1/181–189; H05K 1/028; H01L 23/02; H01L 23/065; H01L 23/48; H01L 23/481; H01L 23/498; H01L 23/49811; H01L 23/4985; H01L 23/5387; H01L 23/3121; H01L 25/0657
USPC ............ 361/749, 770–795, 816, 818; 174/254–260, 520; 257/685–690, 257/737–738, 777, 787
See application file for complete search history.

(56) References Cited

U.S. PATENT DOCUMENTS

| 6,305,921 B1 * | 10/2001 | Grams ................. H01L 21/565 249/95 |
| 6,562,655 B1 * | 5/2003  | Glenn ................. H01L 23/4334 257/E23.092 |
| 6,621,155 B1 * | 9/2003  | Perino ................. H01L 25/0657 257/691 |
| 8,217,507 B1   | 7/2012  | Galloway et al. |

(Continued)

FOREIGN PATENT DOCUMENTS

KR    101009147 B1    1/2011

*Primary Examiner* — Tuan T Dinh
(74) *Attorney, Agent, or Firm* — Vierra Magen Marcus LLP (57) ABSTRACT

A method of forming a semiconductor device includes forming vertical contact fingers in a substrate having side portions that are flexible. Contact fingers are formed near one or more edges of the flexible side portions of the substrate. After semiconductor dies are mounted to and electrically coupled to the substrate, the semiconductor device may be encapsulated by placing the device in a mold chase including upper and lower mold plates. The lower mold plate is sized smaller than the substrate so that the flexible side portions of the substrate including the contact fingers fold vertically upward to fit within the mold.

18 Claims, 12 Drawing Sheets

(56) References Cited

U.S. PATENT DOCUMENTS

| | | | |
|---|---|---|---|
| 8,551,815 B2* | 10/2013 | Avsian | H01L 21/50 |
| | | | 438/109 |
| 9,548,255 B1 | 1/2017 | Ge et al. | |
| 10,609,844 B1* | 3/2020 | Wu | H05K 7/209 |
| 2006/0043562 A1* | 3/2006 | Watanabe | H05K 1/189 |
| | | | 438/455 |
| 2006/0223227 A1* | 10/2006 | Kubota | H05K 1/189 |
| | | | 257/E23.125 |
| 2006/0228830 A1* | 10/2006 | Lin | H01L 25/0657 |
| | | | 438/109 |
| 2009/0107703 A1* | 4/2009 | Abe | H01L 23/49822 |
| | | | 174/254 |
| 2010/0025844 A1* | 2/2010 | Yamazaki | H01L 21/6835 |
| | | | 257/E23.06 |
| 2010/0038765 A1* | 2/2010 | Byun | H01L 25/0657 |
| | | | 257/E25.027 |
| 2011/0155809 A1* | 6/2011 | Reed | G06K 19/07724 |
| | | | 29/841 |
| 2013/0249071 A1* | 9/2013 | Yao | H01L 21/4842 |
| | | | 257/676 |
| 2016/0056127 A1* | 2/2016 | Lee | H01L 24/49 |
| | | | 257/659 |
| 2020/0135598 A1* | 4/2020 | Watanuki | H05K 1/189 |

* cited by examiner

METHOD OF FORMING A SEMICONDUCTOR DEVICE INCLUDING VERTICAL CONTACT FINGERS

BACKGROUND

The strong growth in demand for portable consumer electronics is driving the need for high-capacity storage devices. Non-volatile semiconductor memory devices are becoming widely used to meet the ever-growing demands on digital information storage and exchange. Their portability, versatility and rugged design, along with their high reliability and large capacity, have made such memory devices ideal for use in a wide variety of electronic products, including for example digital cameras, digital music players, video game consoles, computer SSDs, PDAs and cellular telephones.

While many varied packaging configurations are known, flash memory semiconductor devices may in general be assembled as system-in-a-package (SIP) or multichip modules (MCM), where a plurality of semiconductor die are mounted and interconnected to an upper surface of a small footprint substrate. The substrate may in general include a rigid, dielectric base having a conductive layer etched on one or both sides. Where the device is to be used as a removable memory card, contact fingers are formed in the conductive layer on a bottom of the substrate. The top and bottom surfaces of the substrate are covered by a layer of solder mask, leaving the contact fingers exposed in recesses formed in the solder mask. Semiconductor dies are then mounted on the solder mask, on the top of the substrate, electrically connected to the substrate, and the dies are then encapsulated in a mold compound.

Given the small overall footprint of memory cards, the semiconductor dies on the top surface of the substrate are generally mounted over the recessed contact fingers on a bottom surface of the substrate. The dies and substrate are subject to high compressive forces during the encapsulation process, which can cause the semiconductor dies to crack.

Another problem with conventional designs is the size of host device memory card sockets for receiving removable memory cards. The cards are inserted into the host device socket along a first (horizontal) axis. The socket requires buckles and socket pins to position the memory card along a second (vertical) axis to ensure proper mating of the socket pins with the contact fingers on the bottom surface of the memory card. These buckles and socket pins take up valuable space along the second axis in the host device, generally 1.5 to 2 times the thickness of the memory card. This space would more preferably be made available for other host device components.

DETAILED DESCRIPTION

The present technology will now be described with reference to the figures, which in embodiments, relate to a semiconductor device including vertical contact fingers. The device includes a substrate having at least portions which are flexible. Contact fingers may be formed near one or more edges of the flexible substrate. After semiconductor dies are mounted to and electrically coupled to the substrate, the semiconductor device may be encapsulated by placing the device in a mold chase including upper and lower mold plates. The lower mold plate is sized smaller than the substrate so that the sides of the substrate including the contact fingers fold vertically upward to fit within the mold. The mold chase is then filled with molten mold compound. When the mold compound hardens, the device may be removed, leaving the contact fingers exposed on the vertical surfaces of the device. Thereafter, the semiconductor device may be used as a removable memory card within a low-profile host device slot. Alternatively, the device may be affixed to a host device such as a printed circuit board.

It is understood that the present technology may be embodied in many different forms and should not be construed as being limited to the embodiments set forth herein. Rather, these embodiments are provided so that this disclosure will be thorough and complete and will fully convey the technology to those skilled in the art. Indeed, the technology is intended to cover alternatives, modifications and equivalents of these embodiments, which are included within the scope and spirit of the technology as defined by the appended claims. Furthermore, in the following detailed description of the present technology, numerous specific details are set forth in order to provide a thorough understanding of the present technology. However, it will be clear to those of ordinary skill in the art that the present technology may be practiced without such specific details.

The terms "top" and "bottom," "upper" and "lower" and "vertical" and "horizontal" as may be used herein are by way of example and illustrative purposes only, and are not meant to limit the description of the technology inasmuch as the referenced item can be exchanged in position and orientation. Also, as used herein, the terms "substantially," "approximately" and/or "about" mean that the specified dimension or parameter may be varied within an acceptable manufacturing tolerance for a given application. In one embodiment, the acceptable manufacturing tolerance is ±2.5% of a given dimension.

For purposes of this disclosure, a connection may be a direct connection or an indirect connection (e.g., via one or more other parts). In some cases, when a first element is referred to as being connected, affixed or coupled to a second element, the first and second elements may be directly connected, affixed or coupled to each other or indirectly connected, affixed or coupled to each other. When a first element is referred to as being directly connected, affixed or coupled to a second element, then there are no intervening elements between the first and second elements (other than possibly an adhesive or melted metal used to connect, affix or couple the first and second elements).

Figure 1:
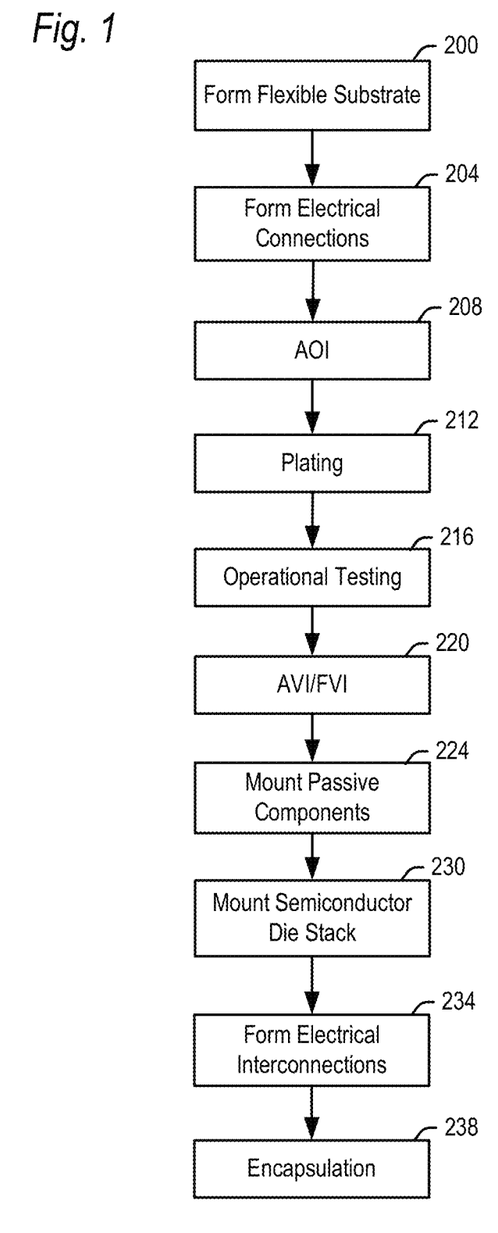
FIG. 1 is a flowchart of the overall fabrication process of a substrate and a semiconductor device using that substrate according to embodiments of the present technology.

An embodiment of the present technology will now be explained with reference to the flowchart of FIG. 1 and the top, side and perspective views of FIGS. 2 through 18. The figures show a single semiconductor device 150 including a flexible substrate 100, or portions thereof, but it is understood that the semiconductor device may be assembled from a panel of flexible substrates to achieve economies of scale.

Figure 2:
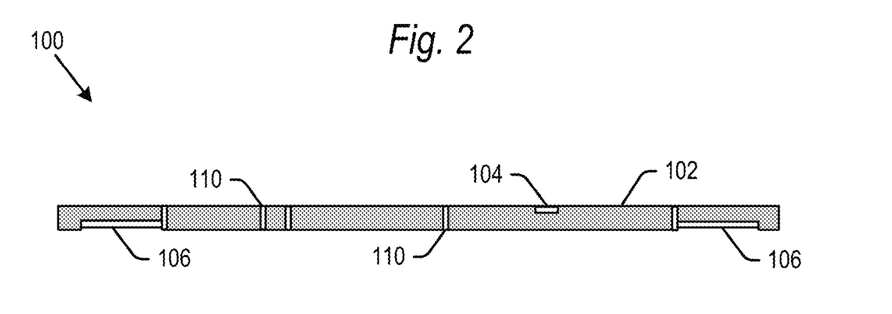
FIG. 2 is an edge view of a substrate of a semiconductor device at a first step in the fabrication process according to an embodiment of the present technology.
Figure 3:
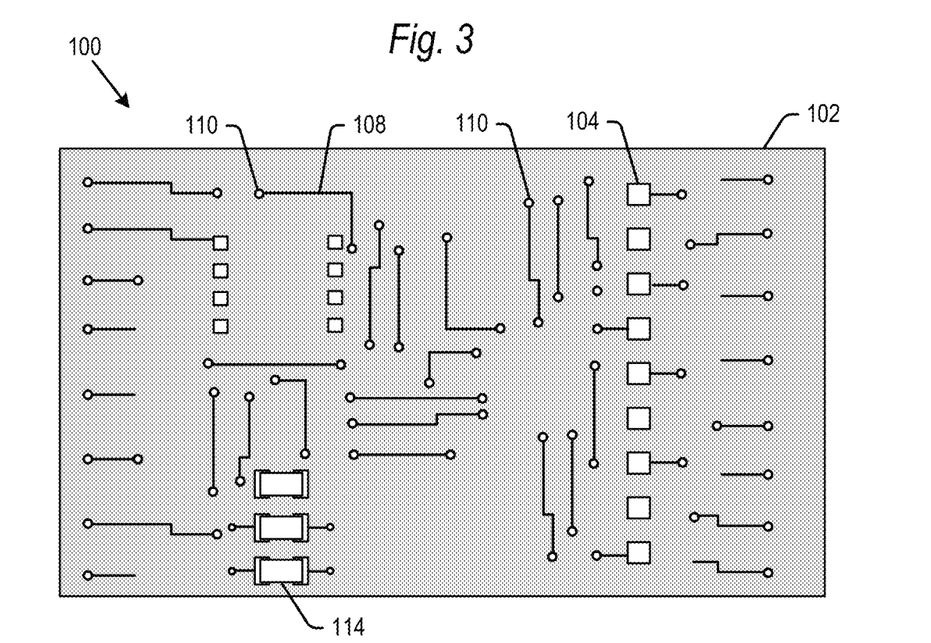
FIG. 3 is a top view of the substrate of FIG. 2.
Figure 4:
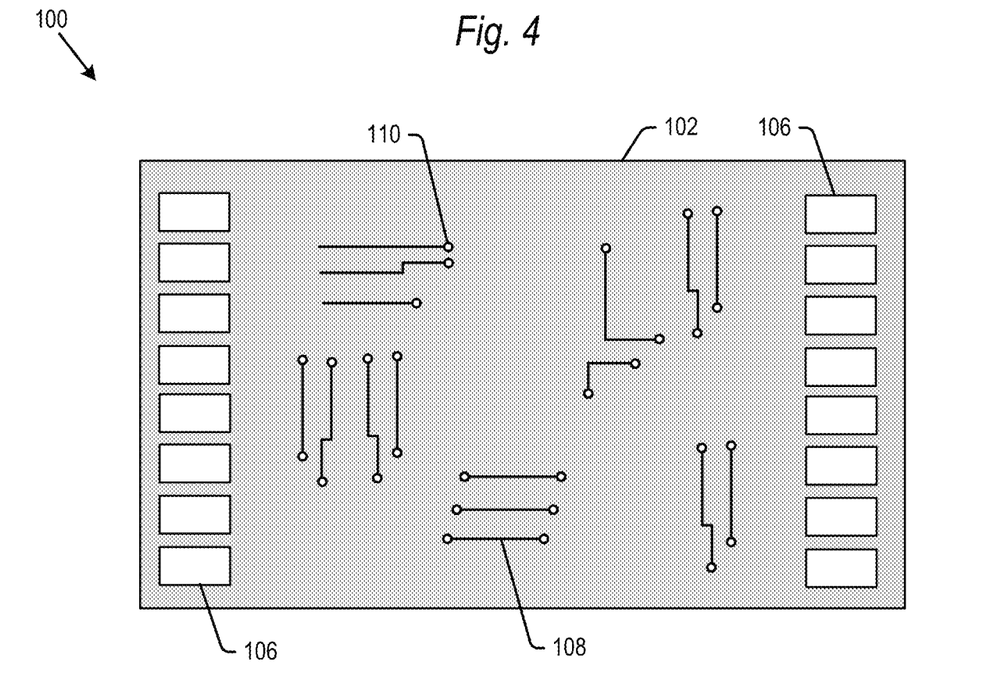
FIG. 4 is a bottom view of the substrate of FIG. 2.

In step 200, a substrate 100 is fabricated of flexible material as shown in the edge, top and bottom views of FIGS. 2-4. Flexible substrate 100 is a signal-carrier medium provided for transferring electrical signals between semiconductor dies mounted on the substrate and a host device, as explained below. In one embodiment of the present technology, the flexible substrate 100 may be a flexible printed circuit (also referred to as a flex circuit) including a dielectric base 102 formed of a flexible polymer such as polyimide, PEEK, PET, polyester or other thin films. The flexible substrate 100 may also be formed from any of a wide variety of other flexible signal-carrier mediums including flex tapes, lead frames, interposers or combinations thereof.

The base 102 of flexible substrate 100 may be formed with electrical connectors in step 204 including contact pads 104, contact fingers 106 and electrical traces 108 on top and bottom surfaces of the base 102, and possibly within internal layers of the base 102. Through-hole vias 110 may be provided for electrically coupling the contact pads 104, contact fingers 106 and electrical traces 108 on different external and/or internal surfaces of the base 102. The contact pads 104 may be provided in an upper surface for receiving wire bonds or other soldered electrical connectors. The contact fingers 106 may be provided in a bottom surface for mating with external connectors such as socket pins or other features of a host device as explained below. The electrical connections may be formed by laminating copper pads and strips onto the upper and lower surfaces of the base. The electrical connectors may also be formed by sandwiching electrical connectors between one or more layers of the base 102.

The pattern of electrical connectors including contact pads 104, contact fingers 106, traces 108 and vias 110 is shown by way of example only. Further embodiments may have different patterns of contact pads 104, contact fingers 106, traces 108 and/or vias 110. The electrical connectors may be formed of a variety of materials other than copper in further embodiments, including copper alloys, plated copper alloys, Alloy 42 (42Fe/58Ni), or other metals and materials suitable for use on or in a flexible substrate. The electrical connectors may also be formed by a variety of methods other than lamination in further embodiments, including screen printing and photolithography.

Referring again to FIG. 1, the flexible substrate 100 may next be inspected in step 208, for example in an automatic optical inspection (AOI). Once inspected, the contact pads 104 and fingers 106 may be plated in step 212, for example, with a Ni/Au, Alloy 42, or the like, in a known electroplating or thin film deposition process. The flexible substrate 100 may next undergo operational testing in step 216 to ensure the substrate 100 is working properly. In step 220, the substrate may be visually inspected, including for example an automated visual inspection (AVI) and a final visual inspection (FVI) to check for contamination, scratches and discoloration. One or more of these steps may be omitted or performed in a different order in further embodiments.

Assuming the flexible substrate 100 passes inspection, passive components 114 (FIG. 3) may next be affixed to the substrate 100 in a step 224. The one or more passive components may include for example one or more capacitors, resistors and/or inductors, though other components are contemplated. The passive components 114 shown are by way of example only, and the number, type and position may vary in further embodiments.

Figure 5:
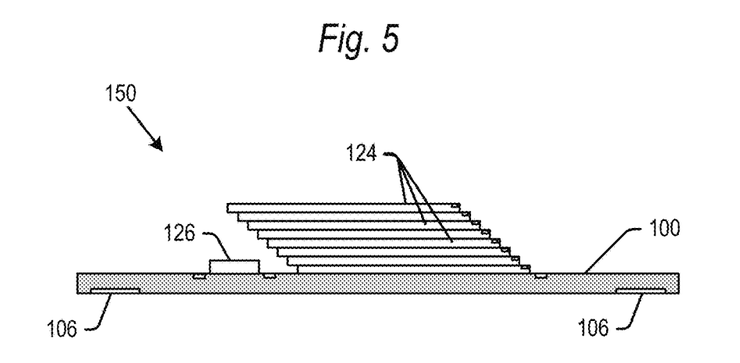
FIG. 5 is a side view of a number of semiconductor dies mounted on a substrate according to embodiments of the present technology.

In step 230, one or more semiconductor dies 120 may be mounted on the flexible substrate 100, as shown in the edge view of FIG. 5. The semiconductor dies 120 may for example be memory die such as 2D NAND flash memory or 3D BiCS (Bit Cost Scaling), V-NAND or other 3D flash memory, but other types of dies 120 may be used. These other types of semiconductor dies include but are not limited to RAM such as an SDRAM, DDR SDRAM, LPDDR and GDDR.

Where multiple semiconductor dies 120 are included, the semiconductor dies 120 may be stacked atop each other in an offset stepped configuration to form a die stack as shown for example in FIG. 5. The number of dies 120 shown in the stack is by way of example only, and embodiments may include different numbers of semiconductor dies, including for example 1, 2, 4, 8, 16, 32 or 64 dies. There may be other numbers of dies in further embodiments. The dies may be affixed to the substrate and/or each other using a die attach film. As one example, the die attach film may be cured to a B-stage to preliminarily affix the dies 120 in the stack, and subsequently cured to a final C-stage to permanently affix the dies 120 to the substrate 100. FIG. 5 also shows a controller die 126 mounted to the flexible substrate 100. Controller die 126 may for example be an ASIC for controlling transfer of signals and data to and from the memory dies 120.

Figure 6:
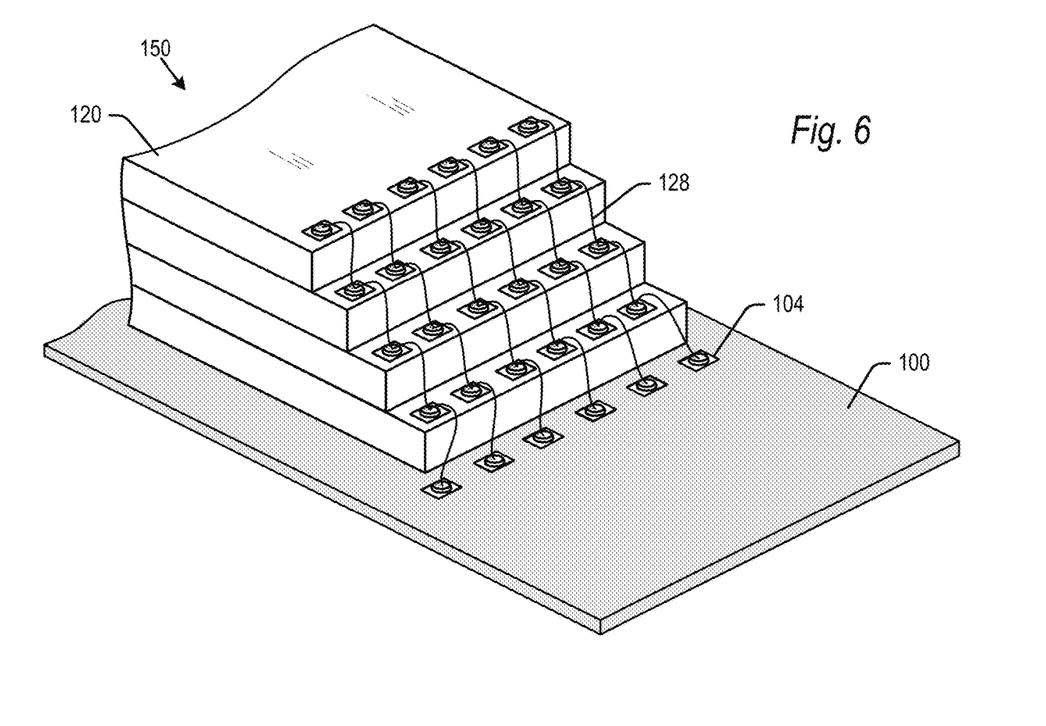
FIG. 6 is a perspective view of a number of semiconductor dies mounted on, and wire bonded to, a substrate according to embodiments of the present technology.

In step 234, the semiconductor dies 120 may be electrically interconnected to each other and to the flexible substrate 100. Controller die 124 may also be wire bonded or flip-chip bonded to the substrate in step 234. FIG. 6 shows a perspective view of wire bonds 128 being formed between corresponding die bond pads on respective dies 120 down the stack, and then bonded to contact pads 104 on the upper surface of the flexible substrate 100. The wire bonds may be formed by a ball-bonding technique, but other wire bonding techniques are possible. The semiconductor dies 120 may be electrically interconnected to each other and the substrate 100 by other methods in further embodiments, including by through-silicon vias (TSVs) and flip-chip technologies.

Figure 7:
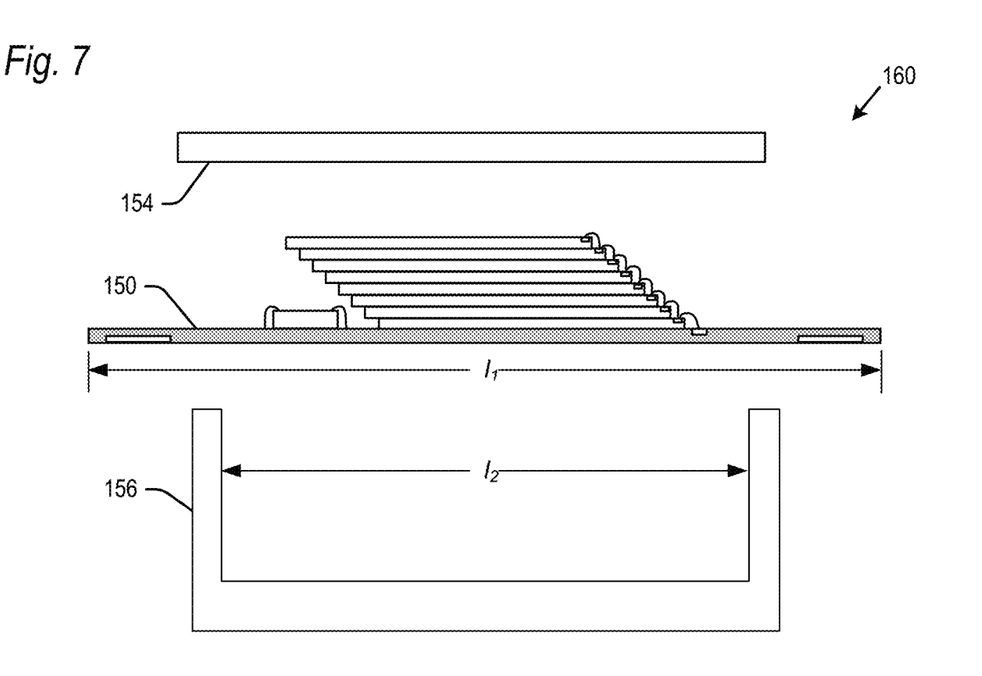
FIG. 7 is a side view of the semiconductor device positioned at a mold chase for encapsulation according to embodiments of the present technology.
Figure 8:
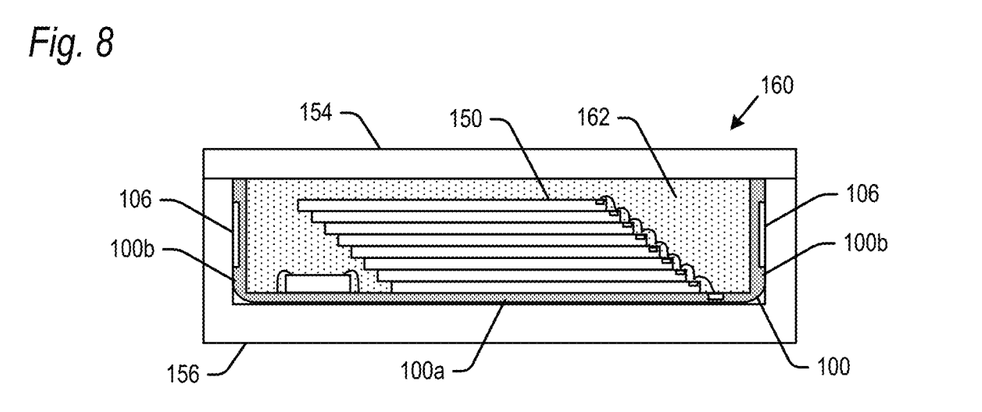
FIG. 8 is a cross-sectional side view of a semiconductor device encapsulated with mold compound within mold plates during the encapsulation process according to embodiments of the present technology.

Following electrical connection of the dies 120 to the substrate 100, the semiconductor device 150 may be encapsulated in a mold compound 130 in a step 238 as will now be explained with reference to the side and cross-sectional side views of FIGS. 7-9. FIG. 7 shows the semiconductor device 150 positioned between top and bottom mold plates 154, 156 of mold chase 160. As shown, the length, $l_1$, of the flexible substrate is greater than the interior length, $l_2$, of the bottom mold plate 156. Thus, the sides of the flexible substrate 100 including the contact fingers 106 are folded upward as shown in FIG. 8 when the semiconductor device 150 is placed into the bottom mold plate 156 for encapsulation.

After positioning within the bottom mold plate 156, the top mold plate 154 may seal on top of the bottom mold plate and molten mold compound 162 injected into the cavity between the top and bottom mold plates, around the semiconductor dies 120 and wire bonds 128. The mold compound 162 may be injected through a port in the top mold plate under pressure so that a bottom (horizontal) portion 100a of the flexible substrate 100 is flush against a bottom portion of mold plate 156, and side (vertical) portions 100b of the flexible substrate 100 are flush against side portions of the mold plate 156.

As noted, the side portions of the mold plate 156 may be vertical to provide the side portions 100b of substrate 100 at right angles to the bottom portion 100a of substrate 100. However, the side portions of the mold plate 156 may in general be at some nonzero angle to the bottom portion of the mold plate 156, which nonzero angle may be orthogonal or non-orthogonal. The nonzero angle of the side and bottom portions of the mold plate 156 provide the substrate with side portions 100b at some nonzero angle to the bottom portion 100a. This nonzero angle may be 90°, greater than 90° or less than 90°.

The components on the semiconductor device 150 (for example dies 120, 124 and the passive components 114) are positioned on the substrate 100 so as to remain on the bottom portion 100a of substrate 100 when side portions 100b are folded upward. However, it is conceivable that one or more dies 120, 124, passive components 114 and/or other components on substrate 100 are affixed to the side portions 100b when the substrate 100 is folded. Notably, the contact fingers 106 reside in the side portions 100b when the substrate is folded.

Mold compound 162 may include for example solid epoxy resin, Phenol resin, fused silica, crystalline silica, carbon black and/or metal hydroxide. Other mold compounds from other manufacturers are contemplated. The mold compound may be applied by various known processes, including by compression molding, transfer molding or injection molding techniques. It is possible that the side portions 100b of substrate 100 be folded before the substrate 100 is placed within the mold chase. In such embodiments, the semiconductor device 150 may be encapsulated by other methods including FFT (flow free thin) molding.

Figure 9:
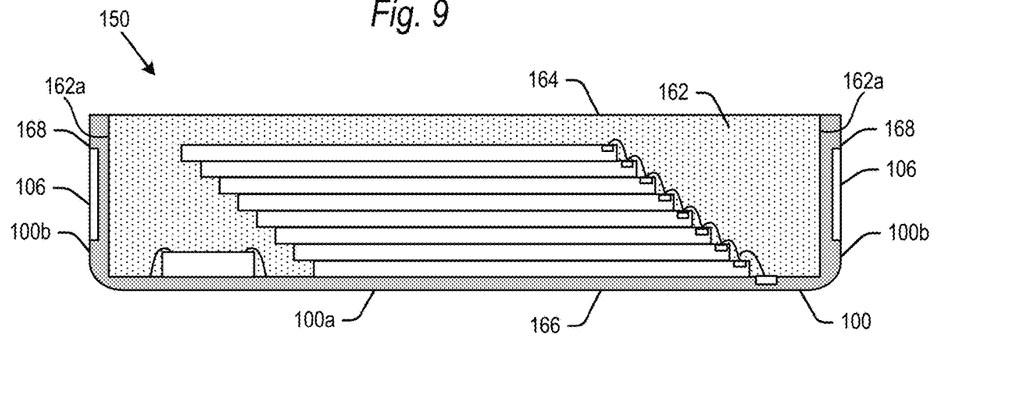
FIG. 9 is a cross-sectional side view of a completed semiconductor device according to embodiments of the present technology.

FIG. 9 is a cross-sectional side view showing a finished semiconductor device 150 after the mold compound 162 hardens and the device 150 has been removed from the mold chase 160. The mold compound 162 covers and protects the components on the side of the substrate 100 covered by the mold compound 162, such as dies 120, 124 and wire bonds 128. The mold compound 162 also includes sidewalls 162a to which the side portions 100b of substrate 100 adhere when vertically bent or folded. The contact fingers 106 are exposed on the vertical side portions 100b on the sidewalls 162a. The semiconductor device 150 includes first and second opposed major surfaces 164 and 166, and edges 168 extending between the first and second opposed major surfaces. The contact fingers 106 are located in the edges 168.

Figure 10:
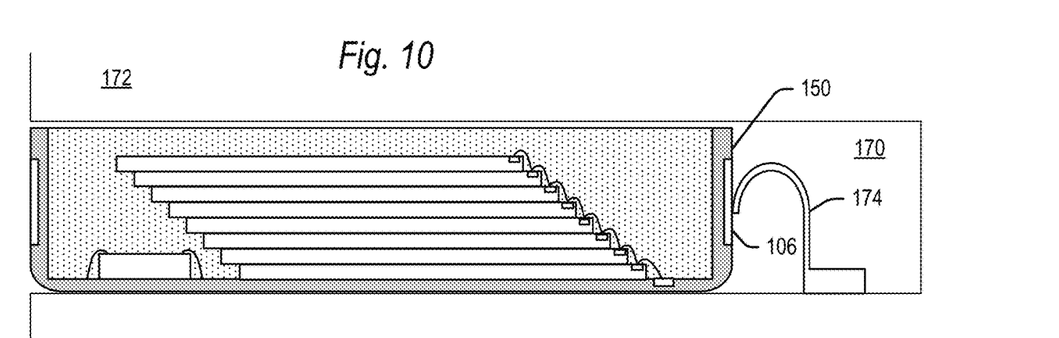
FIG. 10 is a cross-sectional side view of a semiconductor device seated within a slot of a host device.

In embodiments, the semiconductor device 150 may be an LGA (land grid array) package such as a removable memory card, where the device 150 may be removably inserted into the slot of a host device (such as a laptop, desktop, smartphone, camera, etc.). FIG. 10 is a cross-sectional side view of the semiconductor device 150 inserted into a slot 170 of a host device 172. The vertical contact fingers 106 may contact a socket pin 174 to enable transfer of signals and data between the semiconductor device 150 and the host device 172. The semiconductor device 150 may be inserted along the long axis of the slot 170 until the contact fingers 106 bear against the socket pins 174. Slight compression of the socket pins 174 by the device 150 ensures good electrical contact between the contact fingers 106 and socket pins 174 in the direction of the long axis of the slot 170. Catches (not shown) may releasably hold the semiconductor device 150 in the slot 170 upon full insertion of the device 150.

As noted in the Background section, conventional memory cards required a slot height of 1.5 to 2 times their thickness to accommodate components such as buckles and socket pins above and below the memory card. These components were required to ensure good contact of the memory card fingers on the bottom surface of the memory card with the socket pins along an axis transverse to the long axis of the slot. Provision of the contact fingers on a vertical edge of the semiconductor device as explained above does away with this requirement, allowing a slot to have a height that is about the same thickness of the device 150.

Figure 11:
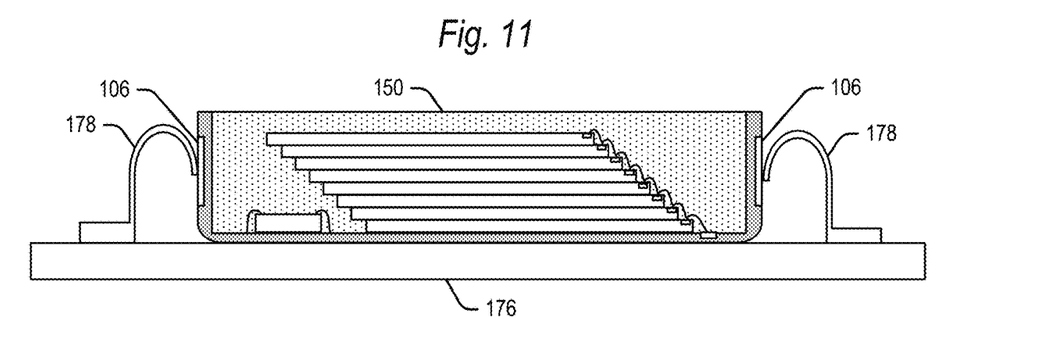
FIG. 11 is a cross-sectional side view of a semiconductor device pinned on a host device such as a printed circuit board.

In the above-described embodiment, the semiconductor device 150 may be removable device for insertion into and removal from multiple host devices. In further embodiments, the semiconductor device 150 may be configured to mount onto a host device such as a printed circuit board. For example, FIG. 11 shows an embodiment where the semiconductor device mounts on a printed circuit board (PCB) 176 upon being press-fit between a pair of spaced apart rows of pins 178. The distance between opposed pairs of pins 178 in each row on PCB 176 may be provided based on the length of the semiconductor device 150 such that the pins 178 compress slightly when the device is inserted between the pins on opposed sides of the device 150. This ensures good contact between the pins 178 and fingers 106 on opposed sides of the device 150, and also secures the device 150 onto the PCB.

Figure 12:
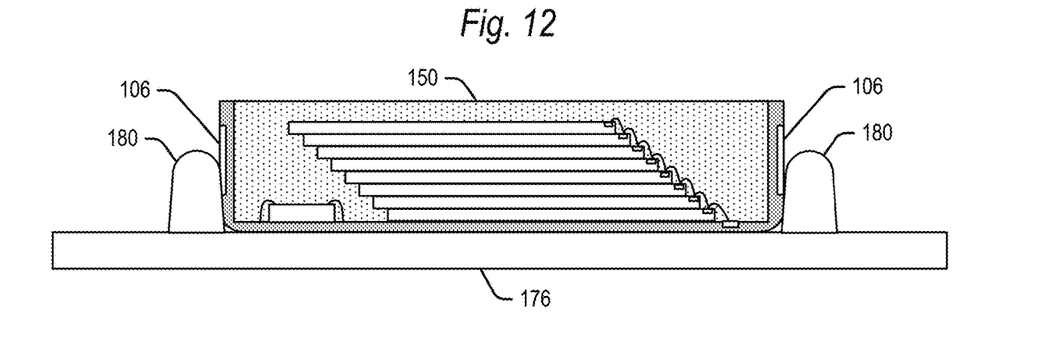
FIG. 12 is a cross-sectional side view of a semiconductor device soldered on a host device such as a printed circuit board.

FIG. 12 illustrates a further embodiment including solder pillars 180 on the PCB 176. As above, the solder pillars on opposed sides are provided based on the length of the semiconductor device 150 such that the solder pillars on opposed sides are positioned adjacent or in slight contact with the contact fingers when the semiconductor device is positioned on the PCB. Thereafter, heat may be applied to reflow the solder pillars 180 against the contact fingers 106 to permanently mount the semiconductor device 150 to the PCB with electrical coupling of the contact fingers to the PCB through the solder pillars. Other types of meltable contacts may be used in place of the solder pillars, including solder balls or solder paste.

Figure 13:
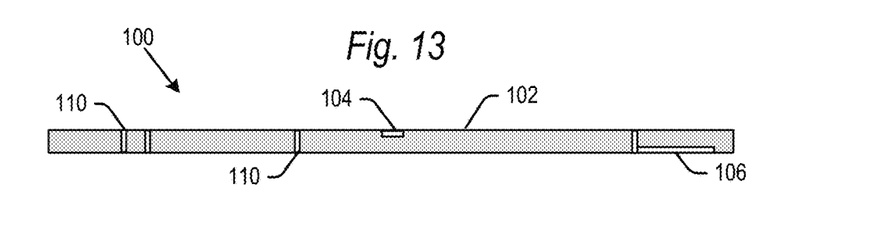
FIG. 13 is a side view of a substrate of a semiconductor device at a first step in the assembly process according to an alternative embodiment of the present technology.
Figure 14:
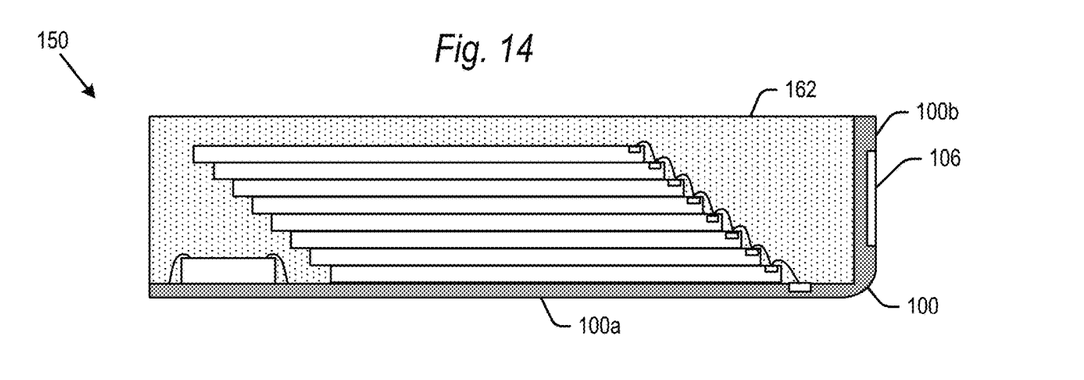
FIG. 14 is a cross-sectional side view of the semiconductor device made with the substrate of FIG. 13.

In embodiments described above, the substrate 100 has contact fingers 106 on two opposed edges. This need not be so in further embodiments. FIGS. 13 and 14 are side cross-sectional views of an embodiment including contact fingers 106 at a single edge of the substrate 100. In this embodiment, the semiconductor device 150 may be assembled as described above. The reference numbers in FIG. 13 correspond to the electrical connectors described above. However, in this embodiment, only a single side (the side including contact fingers 106) is folded up when the device is encapsulated, as shown in FIG. 14. The semiconductor device 150 of FIG. 14 may be used in any of the embodiments described above, including as a removable card within a slot of a host device, or affixed to a PCB.

In embodiments described above, the base 102 of the substrate 100 is composed entirely of flexible material. However, in further embodiments, the substrate 100 may be composed of both flexible and rigid materials. Such a substrate is referred to herein as a mixed substrate. An example of a mixed substrate 300 is shown in the top view and cross-sectional side view of FIGS. 15 and 16. Mixed substrate 300 includes rigid base sections 300a, 300b and 300c, and flexible base sections 300d and 300e. The flexible base sections 300d and 300e may be formed of any of the above-described materials used in flexible substrate 100, and may operate as does flexible substrate 100. Although not shown, the flexible base sections 300d and 300e may include electrical connectors as described above.

Figure 15:
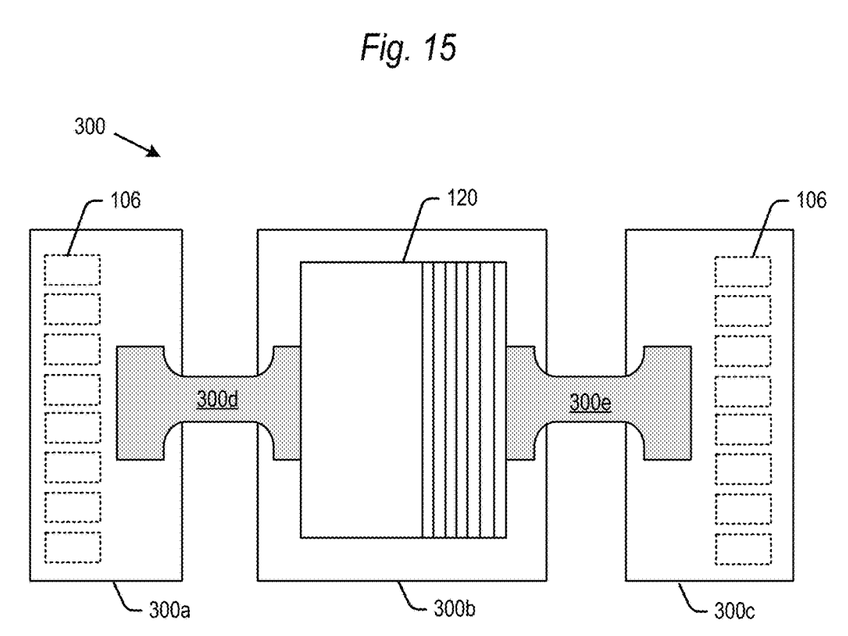
FIG. 15 is a top view of a substrate and semiconductor dies according to an alternative embodiment of the present technology.
Figure 16:
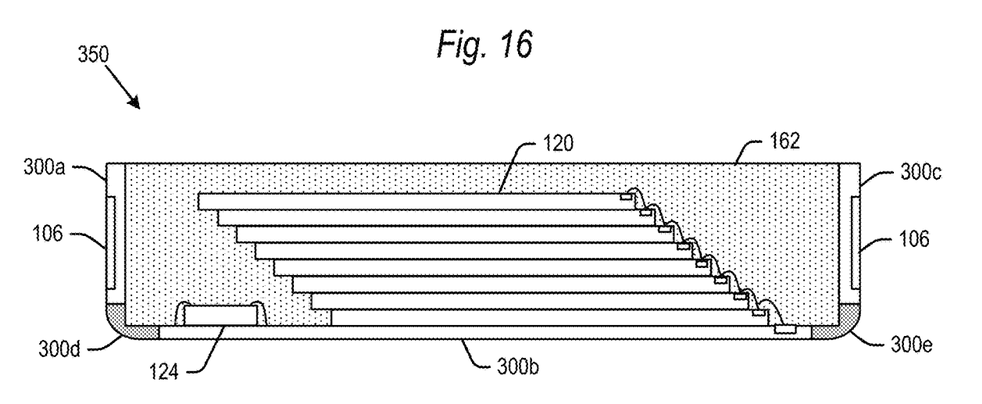
FIG. 16 is a cross-sectional side view of the semiconductor device made with the substrate and semiconductor dies of FIG. 15.

Rigid base sections 300a, 300b and 300c may each be formed of a rigid dielectric core of various dielectric materials such as for example, polyimide laminates, epoxy resins including FR4 and FR5, bismaleimide triazine (BT), and the like. Conductive layers of for example copper or copper alloys may be formed on the opposed surfaces of the core. The conductive layers may be etched to form contact pads (on first sides of one or more of the rigid base sections), contact fingers 106 (on second sides of the rigid base sections 300a and 300c opposed to the first sides), and electrical traces. Vias may further be provided through the rigid base sections to electrically couple electrical connectors on opposed sides of the rigid base sections.

The electrical connectors in the rigid base section 300b may be electrically coupled to the electrical connectors in rigid base sections 300a and 300c by the flexible base sections 300d and 300e. The electrical connectors are omitted from the rigid base sections in FIG. 15 apart from the contact fingers 106 (shown in phantom as they are positioned on the side of the mixed substrate not visible from the top view of FIG. 15).

Semiconductor dies 120, die 124 and other components may be mounted to the rigid base section 300b, and electrically coupled to the rigid base section 300b with wire bonds as described above. The mixed substrate 300, dies, wire bonds and other components may then be encapsulated in mold compound 162 as described above to form finished semiconductor device 350 shown in FIG. 16. The mixed substrate 300 may bend at the flexible base sections 300d and 300e to fix the contact fingers 106 of the rigid base sections in vertical (or other) orientations.

Figure 17:
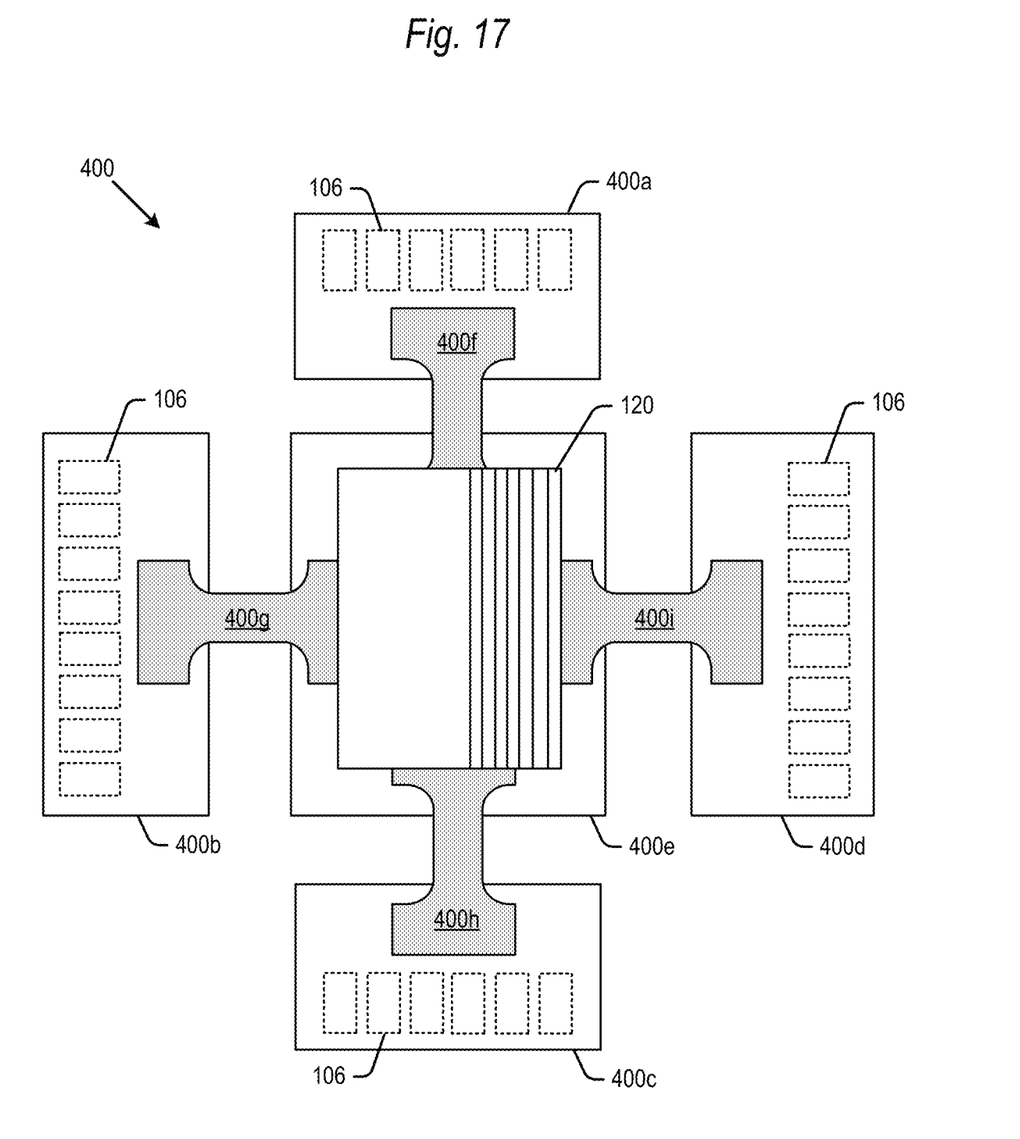
FIG. 17 is a top view of a substrate and semiconductor dies according to a further alternative embodiment of the present technology.
Figure 18:
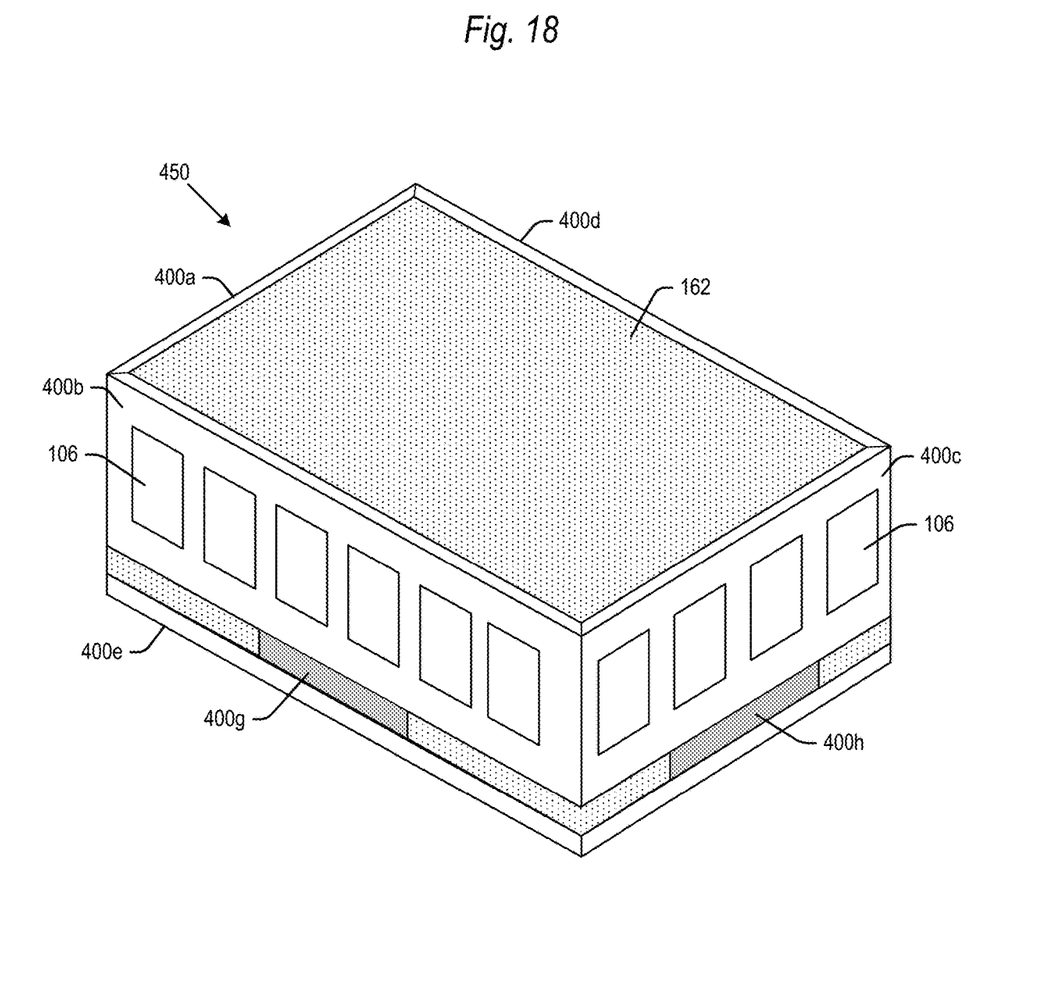
FIG. 18 is a perspective view of the semiconductor device made with the substrate and semiconductor dies of FIG. 17.

FIGS. 17 and 18 illustrate a further embodiment of the present technology. The embodiment of FIGS. 17 and 18 is similar to the embodiment of FIGS. 15 and 16, but the embodiment of FIGS. 17 and 18 illustrate a mixed substrate 400 having rigid base sections 400a, 400b, 400c and 400d extending from four sides of a central rigid base section 400e. The rigid base sections 400a-400d are electrically coupled to the central rigid base section 400e by flexible base sections 400f, 400g, 400h and 400i. Again, the electrical connectors are omitted from FIG. 17 apart from the contact fingers 106 on the back sides of the rigid base sections 400a-400d.

Semiconductor dies 120, die 124 and other components may be mounted to the central rigid base section 400e, and electrically coupled to section 400e with wire bonds as described above. The mixed substrate 400, dies, wire bonds and other components may then be encapsulated in mold compound 162 as described above to form finished semiconductor device 450 shown in FIG. 18. The mixed substrate 400 may bend at all four flexible base sections 400f-400i as shown in FIG. 18 to fix the contact fingers 106 of the rigid base sections in vertical (or other) orientations.

Figure 19:
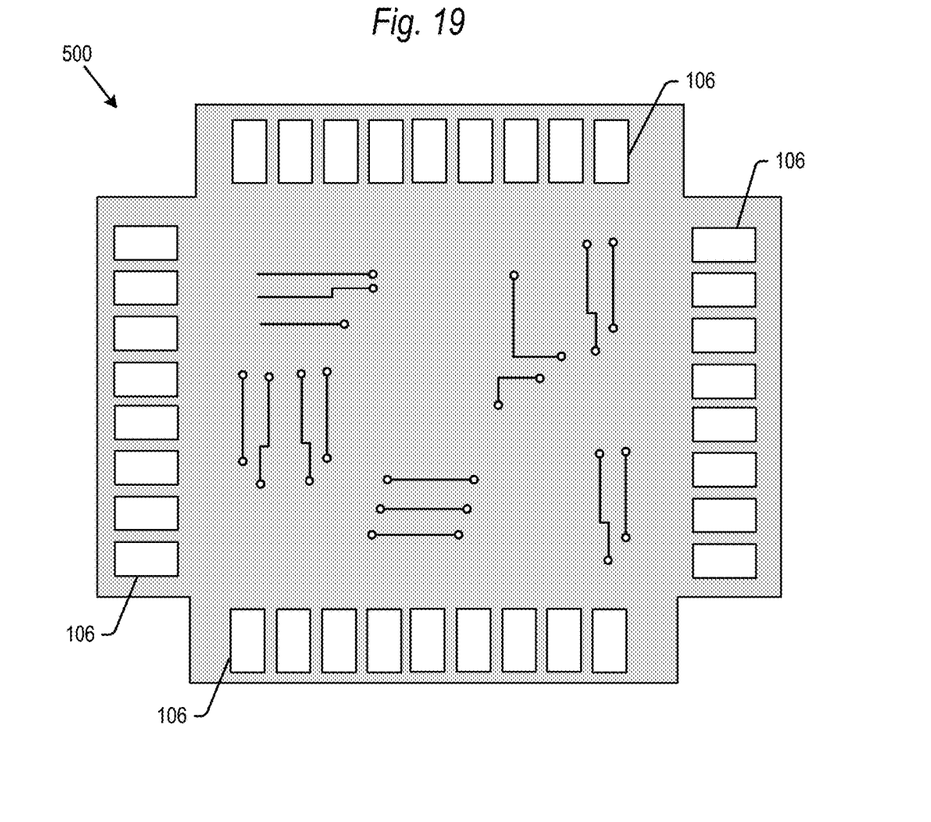
FIG. 19 is a bottom view of a substrate according to a further alternative embodiment of the present technology.

The semiconductor device 450 shown in FIG. 18 is made from a mixed substrate 400 having both rigid and flexible portions, with the flexible portions bending upward when encapsulated to position contact fingers 106 in four vertical side walls of the semiconductor device 450. In further embodiments, the semiconductor device 450 may be made entirely of a flexible substrate, such as shown in the bottom view of flexible substrate 500 in FIG. 19. The flexible substrate 500 may be similar to flexible substrate 100 described above, but the flexible substrate 500 may have contact fingers around all four sides of the flexible substrate. During or before the encapsulation process, all four sides may bend upward to provide a finished semiconductor device similar to that shown in FIG. 18, with contact fingers 106 in all four vertical edges of the device.

In embodiments described above, the flexible substrate 100 may get pressed against the sides of the bottom mold plate 156 during encapsulation. The resulting semiconductor device may have the flexible substrate visible at the outer surface of the semiconductor device. In a further embodiment, shown in the cross-sectional edge view of FIG. 20, the flexible substrate may also be buried within the mold compound 162. In such embodiments, the contact fingers 106 may be built up to extend beyond the surface of the flexible substrate 100 (not necessarily drawn to scale in FIG. 20). The sides 100b get folded upward before or during the encapsulation process as described above, but are not pressed against the edges of the bottom mold plate 156. Thus, mold compound covers the sides 100b of the flexible substrate 100.

Figure 20:
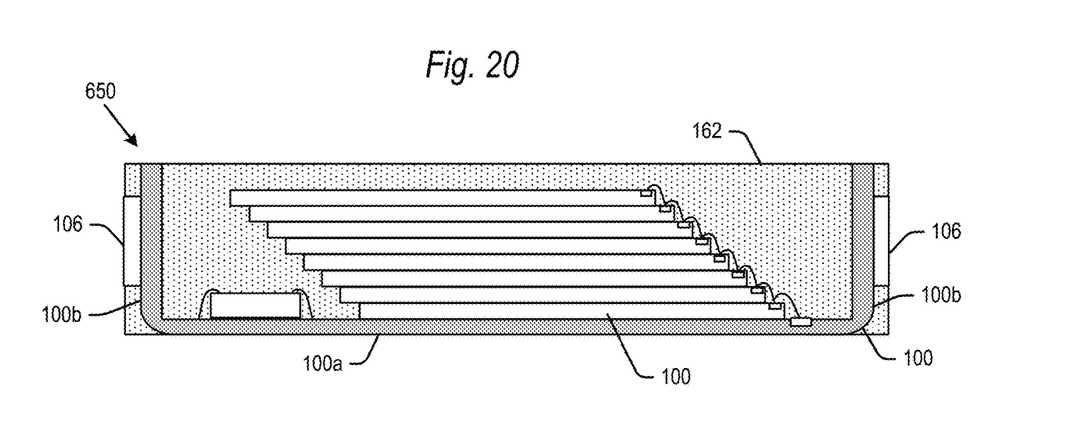
FIG. 20 is a cross-sectional side view of a semiconductor device according to a further alternative embodiment of the present technology.

The contact fingers 106 in this embodiment may be pressed against the sides of the mold plate 156 to leave the surfaces of the contact fingers exposed after the encapsulation process. Alternatively, the contact fingers 106 may also be buried within the mold compound 162, and then the thickness of vertical sides of the semiconductor device including the contact fingers can be thinned using a grinding wheel and/or etching to expose the contact fingers.

In summary, in one example, the present technology relates to a semiconductor device, comprising: a substrate comprising: a flexible base, comprising a first portion and a second portion bent at a nonzero angle to the first portion; electrical connectors formed in or on the flexible base electrically connecting the first and second portions, the electrical connectors comprising a plurality of contact fingers in the second portion of the substrate; one or more semiconductor die mounted on the first portion of the substrate and electrically coupled to the first portion of the substrate; and mold compound encapsulating the one or more semiconductor dies, the second portion of the substrate being directly affixed to the mold compound.

In another example, the present technology relates to a semiconductor device, comprising: a flexible substrate comprising electrical connectors comprising a first plurality of contact fingers adjacent a first edge of the substrate and a second plurality of contact fingers adjacent a second edge of the substrate opposed to the first edge; one or more semiconductor die mounted on the first portion of the substrate and electrically coupled to the first portion of the substrate; and mold compound encapsulating the one or more semiconductor dies, the mold compound comprising first and second major surfaces, a first sidewall extending between the first and second major surfaces, and a second sidewall opposed to the first sidewall, the second sidewall extending between the first and second major surfaces, the first plurality of contact fingers positioned on the first sidewall and the second plurality of contact fingers positioned on the second sidewall.

In a further example, the present technology relates to a semiconductor device, comprising: one or more semiconductor die; flexible means for electrically coupling to the one or more semiconductor dies and for transferring signals to and from the one or more semiconductor dies, the flexible means comprising contact means for establishing electrical contact with a host device; and mold compound encapsulating the one or more semiconductor dies, the mold compound comprising first and second major surfaces, a first sidewall extending between the first and second major surfaces, and a second sidewall opposed to the first sidewall, the second sidewall extending between the first and second major surfaces, the electrical contact means positioned in one or more of the first and second sidewalls.

The foregoing detailed description of the technology has been presented for purposes of illustration and description. It is not intended to be exhaustive or to limit the technology to the precise form disclosed. Many modifications and variations are possible in light of the above teaching. The described embodiments were chosen in order to best explain the principles of the technology and its practical application to thereby enable others skilled in the art to best utilize the technology in various embodiments and with various modifications as are suited to the particular use contemplated. It is intended that the scope of the technology be defined by the claims appended hereto.

We claim:

1. A method of forming a semiconductor device, comprising the steps of:
    mounting one or more semiconductor dies on a flexible substrate, the flexible substrate having a first length;
    positioning the flexible substrate in a mold chase, the mold chase having a second length less than the first length, and the mold chase having a shape defined by a bottom surface and one or more side surfaces orthogonal to the bottom surface;
    folding the flexible substrate against the bottom surface and side surfaces so that the mold chase changes a shape of the flexible substrate to conform the flexible substrate to the shape of the mold chase;
    encapsulating the one or more semiconductor dies in a mold compound, and
    wherein said step of positioning the flexible substrate in the mold chase, and folding the one or more sides of the flexible substrate comprises the step of folding the one or more sides upward about 90°.

2. The method of claim 1, wherein said step of encapsulating the one or more semiconductor dies comprises the step of adhering the one or more sides of the flexible substrate to a surface of the mold compound.

3. The method of claim 1, further comprising the step of forming one or more contact fingers in the one or more sides of the flexible substrate, on a side of the flexible substrate opposite a side on which the one or more semiconductor dies are mounted, prior to the encapsulating step.

4. The method of claim 1, wherein said step of positioning the flexible substrate in the mold chase, and folding the one or more sides of the flexible substrate comprises the step of folding two opposed sides upward.

5. The method of claim 1, wherein said step of mounting one or more semiconductor dies on the flexible substrate comprises the step of mounting a plurality of non-volatile memory dies on the substrate.

6. The method of claim 1, wherein said step of positioning the flexible substrate in the mold chase and folding the one or more sides of the flexible substrate comprises the steps of positioning the flexible substrate on a bottom mold plate, folding the one or more sides upward, and sealing the flexible substrate within the mold chase with a top mold plate mated to the bottom mold plate.

7. The method of claim 1, wherein said step of encapsulating the one or more semiconductor dies in the mold compound comprises encapsulating the one or more semiconductor dies by flow free thin (FFT) molding.

8. The method of claim 3, further comprising the step of electrically interconnecting the one or more contact fingers with the one or more semiconductor dies.

9. The method of claim 4, further comprising the step of forming one or more contact fingers in each of the two opposed sides of the flexible substrate, on a side of the flexible substrate opposite a side on which the one or more semiconductor dies are mounted, prior to the encapsulating step.

10. The method of claim 5, wherein said step of mounting one or more semiconductor dies on the flexible substrate comprises the step of mounting the one or more semiconductor dies on the substrate in an area spaced from the one or more sides that fold upward during the encapsulation step.

11. The method of claim 6, wherein said step of encapsulating the one or more semiconductor dies in the mold compound comprises injecting molten mold compound into a cavity formed by the top and bottom mold plates.

12. A method of forming a semiconductor device, comprising the steps of:
    forming a flexible substrate with one or more contact fingers formed on a first surface of the flexible substrate, in one or more edge portions of the flexible substrate;
    mounting one or more semiconductor dies on a second surface of the flexible substrate opposite the first surface;
    positioning the flexible substrate in a mold chase, the mold chase changing a shape of the flexible substrate by folding the one or more edge portions upward against sides of the mold chase so that the one or more edge portions of the flexible substrate conform conforming to a contour of the mold chase;
    encapsulating the one or more semiconductor dies in mold compound, and
    wherein said step of positioning the flexible substrate in the mold chase, and folding the one or more edge portions of the flexible substrate comprises the step of folding the one or more edge portions upward about 90°.

13. The method of claim 12, further comprising the step of electrically interconnecting the one or more contact fingers with the one or more semiconductor dies.

14. The method of claim 12, wherein said step of forming the flexible substrate with one or more contact fingers formed in one or more edge portions of the flexible substrate comprises the step of forming contact fingers in two opposed edge portions.

15. The method of claim 12, wherein said step of mounting one or more semiconductor dies on the flexible substrate comprises the step of mounting the one or more semiconductor dies on the substrate in an area spaced from the one or more edge portions that fold upward during the encapsulation step.

16. The method of claim 12, wherein said step of positioning the flexible substrate in the mold chase and folding the one or more edge portions of the flexible substrate comprises the steps of positioning the flexible substrate on a bottom mold plate, folding the one or more edge portions upward, and sealing the flexible substrate within the mold chase with a top mold plate mated to the bottom mold plate.

17. The method of claim 14, wherein said step of positioning the flexible substrate in the mold chase, and folding the one or more edge portions of the flexible substrate comprises the step of folding the two opposed edge portions upward.

18. A method of forming a semiconductor device, comprising the steps of:
    forming a flexible substrate with one or more contact fingers formed on a first surface of the flexible substrate, in one or more edge portions of the flexible substrate, the flexible substrate having a first length;
    mounting one or more semiconductor dies on a second surface of the flexible substrate opposite the first surface;
    positioning the flexible substrate in a mold chase, the mold chase comprising a bottom plate and a top plate, the bottom plate having a bottom surface and side walls orthogonal to the bottom surface, the bottom surface having a second length smaller than the first length, the side walls of the mold chase folding the one or more edge portions to change a shape of the flexible substrate to conform the one or more edge portions of the flexible substrate conforming to a shape of the bottom plate;
    sealing the top plate against the bottom plate;
    encapsulating the one or more semiconductor dies in mold compound, and
    wherein said step of positioning the flexible substrate in the mold chase, and folding the one or more edge portions of the flexible substrate comprises the step of folding the one or more edge portions upward about 90°.

* * * * *